United States Patent [19]

Gray et al.

[11] Patent Number: 5,455,191

[45] Date of Patent: Oct. 3, 1995

[54] METHOD OF FABRICATING AN ASIC CELL HAVING MULTIPLE CONTACTS

[75] Inventors: David A. Gray; Thomas S. W. Wong, both of Santa Clara County, Calif.

[73] Assignee: Synergy Semiconductor Corporation, Santa Clara, Calif.

[21] Appl. No.: 938,433

[22] Filed: Aug. 31, 1992

[51] Int. Cl.$^6$ .................................................. H01L 21/265
[52] U.S. Cl. .............................. 437/50; 437/51; 437/250
[58] Field of Search .................................. 437/49, 50, 51, 437/250; 257/206, 208–210

[56] References Cited

U.S. PATENT DOCUMENTS

| | | | |
|---|---|---|---|
| 4,884,118 | 11/1989 | Hui et al. | 257/206 |
| 5,111,273 | 5/1992 | Orbach et al. | 257/208 |
| 5,208,178 | 5/1993 | Usami | 437/51 |

*Primary Examiner*—Olik Chaudhuri
*Assistant Examiner*—H. Jey Tsai
*Attorney, Agent, or Firm*—Flehr, Hohbach, Test, Albritton & Herbert

[57] ABSTRACT

A high density ASIC cell provides customization solely at the polysilicon #2, insulator #3 levels. High density is achieved by permitting a metal #1 trace to traverse an underlying transistor, without requiring space between adjacent transistors to facilitate traversing interconnects. Oversized collector and emitter traces at the polysilicon #1 level make downward contact with the collector and base regions of the underlying transistor, and provide redundant upward contact with collector and emitter polysilicon #2 traces. Contact between the transistor base and a base polysilicon #2 trace is also made. The polysilicon #2 emitter, base and collector traces provide a replicated, unvarying pattern that preferably defines a 3×3 matrix of potential contact points for overlying metal #1 traces to contact the underlying transistor's emitter, base and collector. A metal #1 trace can traverse this 3×3 matrix simply by not providing openings in the insulating #3 layer beneath the traverse. If a metal #1 trace is to contact a region of the underlying transistor, an opening is made in the insulation #3 layer over the necessary contact in the 3×3 matrix at the polysilicon #2 level. Thus, customization of the ASIC is made at the metal #1 level, and at the insulation #3 level by determining which metal #1 traces will contact what regions of the underlying transistor.

23 Claims, 5 Drawing Sheets

METHOD OF FABRICATING AN ASIC CELL HAVING MULTIPLE CONTACTS

FIELD OF THE INVENTION

This invention relates to semiconductor cell arrays, and more particularly to high density application specific integrated circuit (ASIC) cells forming gate arrays.

BACKGROUND OF THE INVENTION

High density ASIC cell gate array circuits are known in the art. Such circuits typically replicate a pattern of transistors, and include several layers of insulation and conducting material for interconnecting the transistors. Depending upon the desired application, the ASIC manufacturer determines the circuit functions during fabrication using customized mask layouts. These masks generally require several layers to implement, and define the interconnections between the various transistors within the array. Customizing the various mask layouts for a new or modified ASIC is both time consuming and expensive. This is unfortunate because turn-around time in developing prototype ASIC circuitry is critical in bringing new products to market.

ASIC designers are encouraged to fabricate ever smaller, more densely packed and potentially complex functions within a given chip area. Nonetheless conventional cell designs typically must sacrifice 10% –20% of the chip area to leave room for making interconnections. This dedication of chip area is necessary because some interconnection traces would otherwise traverse an area occupied by a transistor. If a transistor must be located in the area to be traversed, the transistor must first be covered with a layer of insulation, over which a layer of conductive material defining the traversing trace is added. These extra layers are undesirable because they require additional production steps, add to production cost, and decrease production yield. Further, the often tortiously long traverse traces add stray capacitance to the circuit being implemented, and generally diminish circuit performance.

One prior art solution for minimizing traversing interconnects is to combine several cells into larger macro-cells. This solution dedicates the transistors in some macro-cells to certain functions that would otherwise require traverses to implement. For example, a macro-cell containing twenty-six transistors might dedicate six of these transistors to serve as current sources, in anticipation that such current sources will be required by the ASIC (and might otherwise require traversing interconnects for implementation). Thus for this macro-cell, only twenty transistors will be available for customized interconnect (as determined during fabrication), while six transistors are only available for use as current sources. Although this dedication approach minimizes traversing interconnects, in some applications not all of the preformed mini-circuits will be required, with the undesired result that the dedicated transistors are wasted and unavailable for other use.

There is a need for a method of fabricating ASIC cells that permits maximum utilization of the cell chip area, while providing relatively rapid and inexpensive customization. Such a method preferably should not rely upon dedicated transistor connections, thereby increasing the number of transistors in a cell or macro-cell available for customized configuration. Further, such a method should accommodate traversing interconnects. The present invention provides such a method.

SUMMARY OF THE INVENTION

An ASIC according to the present invention includes an array with a plurality of replicated transistors formed on a substrate, covered by alternating layers of insulation and conducting material. Each transistor defines a transistor cell area each transistor preferably includes two base regions (e.g., dual base access), two collector regions (e.g., dual collector access), and an emitter region (although the present invention could be implemented with transistors having a single emitter and an integrated transitional management consolidated functional apperture and collector region). Going "upward" from the substrate-transistor level, the layers covering the transistor cells are called insulation #1, polysilicon #1, insulation #2, polysilicon #2, insulation #3 and metal #1.

The polysilicon #1 layer provides a replicated pattern of emitter traces and collector traces that, respectively, permit redundant electrical contact with the underlying emitter and collector transistor regions via openings in the insulation #1 layer. The insulation #1 layer also has openings providing access to the two underlying base regions. The polysilicon #1 traces are preferably oversized to permit electrical contact at at least two contact points on each trace for the purpose of establishing contact with the underlying transistor.

The polysilicon #1 layer is covered with an insulating #2 layer and a polysilicon #2 layer. In the prior art, the ASIC is created from an array by customizing the polysilicon #2 layer, an expensive and time consuming process. Further, such prior art implementation does nothing to solve the problems created by traversing interconnections. By contrast, in the present invention the polysilicon #2 layer is not customized, but is a replicated and unchanging pattern of emitter, base and collector stripe-like traces. (As will be described, the present invention creates an ASIC by customizing the metal #1 layer, a faster and less expensive method than customizing the polysilicon #2 layer.) Not only does the present invention permit quicker and less expensive implementation of ASICs, but it also allows traversing interconnections without sacrificing chip density, without requiring dedicated transistor functions, and without requiring additional layers of insulation and conductive materials.

Via openings in the insulating #2 layer, the emitter and collector polysilicon #2 traces respectively make electrical contact with the underlying polysilicon #1 emitter and collector traces, preferably at two locations. The polysilicon #2 base trace makes electrical contact with the underlying two base regions via openings in the intervening insulation #1 and insulation #2 layers.

Preferably the polysilicon #2 traces are each oversized to provide three points for making electrical contact with the respective underlying transistor region. For example, the polysilicon #2 emitter trace provides three points at which this trace may be contacted to make electrical contact with the underlying transistor emitter. Thus, the polysilicon #2 traces preferably present a 3×3 matrix of option points for making electrical contact with the underlying transistor: three emitter contacts, three base contacts, and three collector contacts. As will be described, the oversized polysilicon #2 traces and the redundancy of contacts they provide allows traversing interconnects.

The insulation #3 layer covers the polysilicon #2 traces. The insulation #3 layer preferably includes a matrix of 3×3 option openings facilitating electrical contact, as required by the ASIC, between an overlying layer of customized metal #1 traces and the underlying 3×3 matrix of polysilicon #2 option points.

In the present invention, the ASIC is created by customizing the metal #1 traces, and by selecting which of the 3×3 option contacts in the polysilicon #2 layer will be opened or closed during fabrication. On one hand, an open option contact in the polysilicon #2 layer facilitates electrical contact between on overlying metal #1 trace and the underlying polysilicon #2 trace (and thus the emitter, base or collector of the underlying transistor). Such electrical contact is facilitated using vias, formed in a manner known to those skilled in the semiconductor fabrication arts.

On the other hand, a closed option contact provides electrical insulation that allows the metal #1 trace to traverse the underlying transistor. Because a 3×3 matrix of polysilicon #2 option points exists, the metal #1 traces can traverse the underlying transistor cell simply by not making electrical contact with the traversed polysilicon #2 option contacts. For example, a metal #1 trace can traverse the underlying transistor by running through the center of the 3×3 matrix simply by not opening up the center option openings in the insulation #3 layer. The ASIC circuitry can still use the underlying transistor, if required, by using the edge contacts in the polysilicon #2 matrix to electrically contact the transistor. Of course the metal #1 trace could traverse a side or corner region of the 3×3 matrix rather than the matrix center.

In addition to providing flexibility in making connections, the present invention shortens trace lengths by avoiding long, tortious traverse paths. Because customization of the ASIC is implemented at the metal #1 layer and insulation #3 layers, with invariant underlying layers, the present invention facilitates rapid and inexpensive ASIC customization and fabrication. Further, chip space need not be dedicated for traversing traces, thus permitting a given chip area to include more transistors. Finally, because the traverse problem is minimized, the present invention does not require dedicated transistors. This allows the circuit designer to utilize all transistors on a chip for custom functions.

In other embodiments, the present invention can provide readily customized electrical connections to diodes, to resistance elements, or to field effect transistors instead of to bipolar devices.

Other features and advantages of the invention will appear from the following description in which the preferred embodiments have been set forth in detail in conjunction with the accompanying drawings.

BRIEF DESCRIPTION OF THE PREFERRED EMBODIMENT

DETAILED DESCRIPTION OF THE PREFERRED EMBODIMENTS

Figure 1:
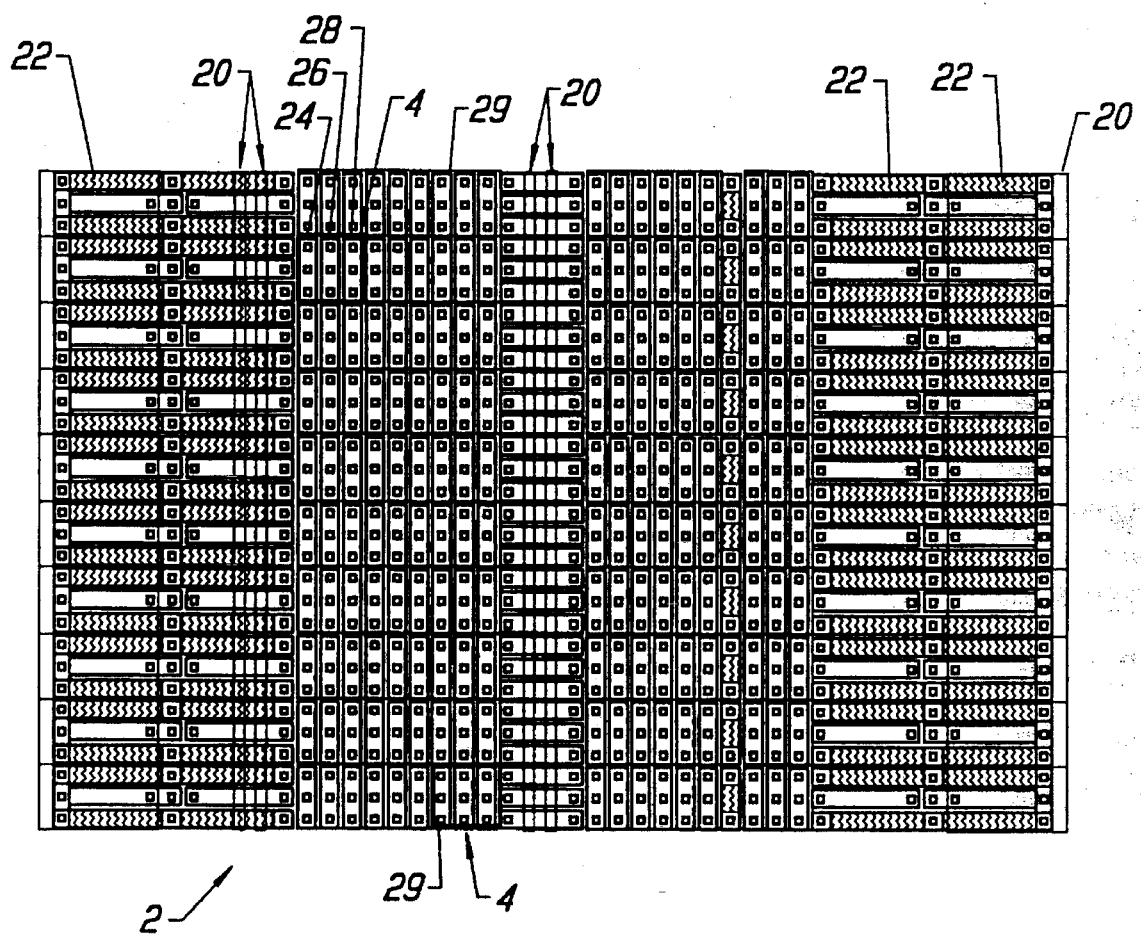
FIG. 1 is a plan view of a generalized gate array, according to a first embodiment of the present invention.

FIG. 1 is a plan view of a generalized, not yet customized, gate array 2 according to a first embodiment of the present invention, depicted as looking downward at the polysilicon #2 traces. The array 2 includes a number of identical transistor cells 4, each cell overlying a transistor 6 fabricated on a substrate 8 (shown in FIGS. 2G and 3). Sixty cells are depicted in FIG. 1, although more or fewer cells could be implemented according to the present invention. For ease of fabrication and enhanced performance, it is preferred that each transistor 6 have an emitter region 10, two base regions 12, 14 and two collector regions 16, 18 (see FIGS. 2F and 3). Multiple collector and base regions contribute to the redundancy that allows the present invention to readily contact transistor 6 to customize an ASIC. Further, this transistor configuration enhances switching speed. Although multiple collectors increase the collector-substrate capacitance, the paralleled collector bulk resistances decrease rapidly, enhancing switching speed overall. (The present invention could, however, be implemented using transistors having a single emitter and collector region.) Array 2 also includes several busses 20 commonly used to provide operating voltages, common signals and the like, as well as several resistors 22 that are available for use by the circuit designer.

Figure 2A:
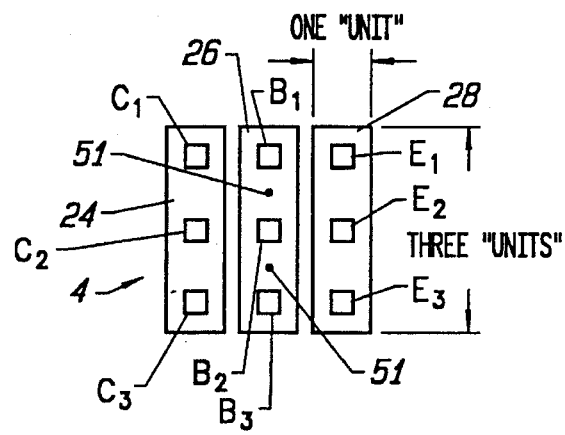
FIG. 2A is a plan view of the second polysilicon layer of a single transistor cell within an array, according to the present invention.

As shown in FIGS. 1 and 2A, three polysilicon #2 stripe-like traces 24, 26, 28 overlie each transistor cell 4. Preferably each of these traces is oversized to provide several option contact points to the underlying transistor 6. By "option contact" it is meant that a contact with the underlying transistor 6 exists on a polysilicon #2 trace, but that it is not necessary to use the contact. As will be described, trace 24 communicates electrically with the collectors 16, 18 of underlying transistor 6, and provides three option collector contacts thereto: C1, C2, C3 (see FIG. 2A). Trace 26 communicates electrically with the underlying transistor bases 8, 14, and provides three option base contacts thereto: B1, B2, B3. Similarly trace 28 communicates electrically with the underlying transistor emitter 10, and provides three option emitter contacts thereto: E1, E2, E3. In the preferred embodiment, these traces form side-by-side rectangles, each trace being approximately three "units" long by one "unit" wide, where the active area of transistor 6 is approximately three units by one unit in size. So configured, the polysilicon #2 traces provide a convenient 3×3 matrix providing nine option points (C1, C2, C3, B1, B2, B3, E1, E2, E3) that form a grid for ease of interconnection to, respectively, the collector, base, and emitter regions of the underlying transistor 6 (see FIGS. 2A and 3).

In the preferred embodiment, the various polysilicon layers have a conductivity of about 2 C/square. Any or all of the polysilicon layers used in the present invention may in fact be implemented with another conductive material, metal for example.

While rectangular traces 24, 26, 28 defining a 3×3 matrix have been described, other trace configurations with differing numbers of matrix contact points could also be used. Applicants have discovered, however, that the disclosed 3×3 matrix is especially efficient. By contrast, a 4×4 matrix actually wastes rather than preserves chip space. The salient characteristics of traces 24, 26, 28 are their replication without customization (unlike the prior art), and their preferably being oversize to provide redundant potential contacts to a region of the underlying transistor and to an overhead layer of metal #1 traces (to be described). In the preferred embodiment, every emitter, base and collector region on every underlying transistor is accessible by at least one matrix contact point on each polysilicon #2 trace, and each polysilicon #2 trace provides up to three potential contact points by which an overhead metal #1 trace may contact the underlying transistor region.

Array 2 as depicted in FIG. 1 further differs from the prior art in that transistor cells 4 can abut one another, with essentially no wasted chip space between adjacent cells. This relatively high cell density is possible because no chip space need be dedicated to traversing traces. In the preferred embodiment, the transistors 6 are formed on the substrate 8 (as opposed to being mask buried), and functional separation between the densely packed transistor cells 4 is enhanced by reactive ion etching a perimeter groove 29 around each transistor cell. Although the active region of each transistor 6 is depicted in FIG. 2E as being about one by three "units", the perimeter groove 29 encloses a three by three unit cell area that is necessary for proper transistor action. In the preferred embodiment, the dimensions of transistor cell 4 are approximately 12 micron ×12 micron, although other dimensions could also be used. Finally, because the present invention readily accommodates traverse interconnects, array 2 in FIG. 1 differs from the prior art in not requiring transistors cells 4 that are dedicated to any given function. As a result, all the transistors 6 in the array are available for customized interconnect as the circuit designer chooses.

Figure 2B:
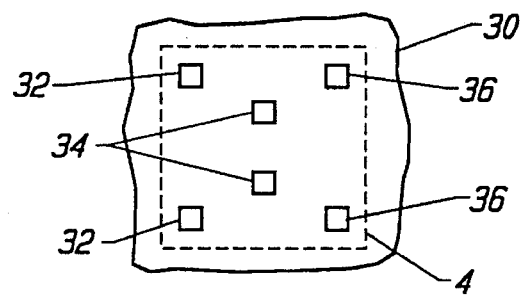
FIG. 2B is a plan view of a portion of the second insulation layer disposed beneath the second polysilicon layer of FIG. 2B, according to the present invention.
Figure 3:
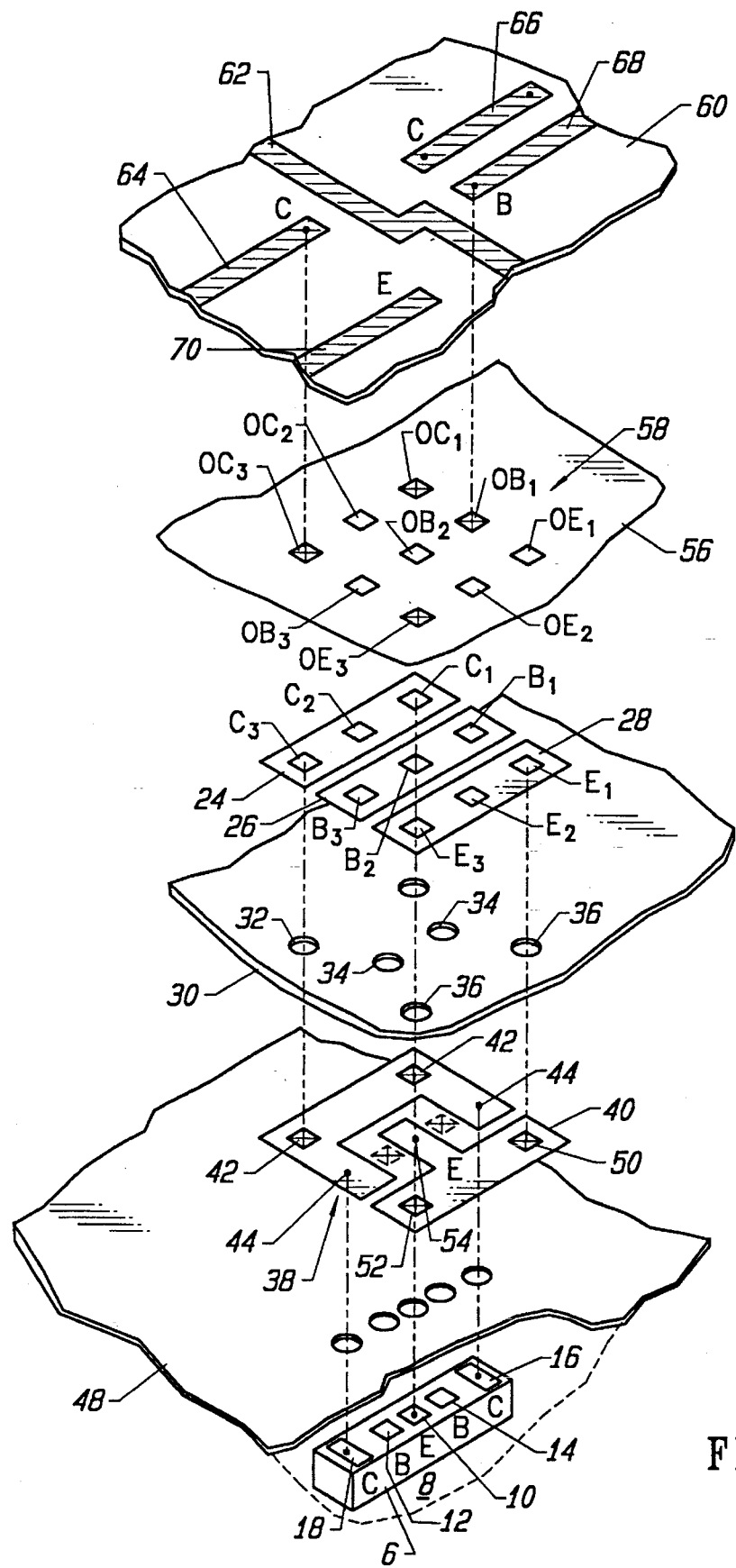
FIG. 3 is an isometric, expanded view depicting various layers comprising a cell within an array, according to the present invention.

As shown in FIG. 2B, beneath the polysilicon #2 traces 24, 26, 28 lies the #2 insulation layer 30, which layer defines through openings 32, 34 and 36. As best seen in FIG. 3, these openings respectively permit redundant electrical connection between the polysilicon #2 collector trace 24 and the underlying collector polysilicon #1 trace 38, between the polysilicon #2 base trace 26 and the underlying transistor base regions 12, 14, and between the polysilicon #2 emitter trace 28 and the underlying emitter polysilicon #1 trace 40. Preferably openings 32 in the #2 insulation layer 30 underlie regions C1, C3 in trace 24, to permit electrical contact with underlying trace 38 at regions 42. Similarly openings 36 underlie regions E1, E3 in trace 28, to permit electrical contact with underlying trace 40 at regions 50. Finally, openings 34 preferably underlie regions 51 in trace 26 to permit trace 26 to make electrical contact with the underlying base regions 12, 14. Openings 30, 32, 34 could, however, be located elsewhere in the insulation #2 layer 30, providing they facilitate electrical connections between trace 24 and trace 38, between trace 28 and trace 40, and between trace 26 and bases 12, 14. The openings 32, 34, 36 and the described electrical connections therethrough are fabricated using conventional techniques known to those skilled in the semiconductor manufacturing art. After fabrication, these openings and the electrical connections therethrough permit any one unit long segment of any polysilicon #2 trace to remain in electrical contact with the corresponding underlying transistor region.

Figure 2C:
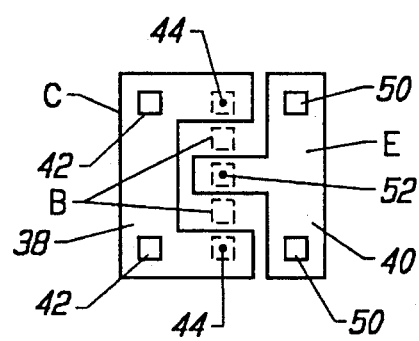
FIG. 2C is a plan view of the first polysilicon layer of a single transistor cell within an array, according to the present invention.
Figure 2D:
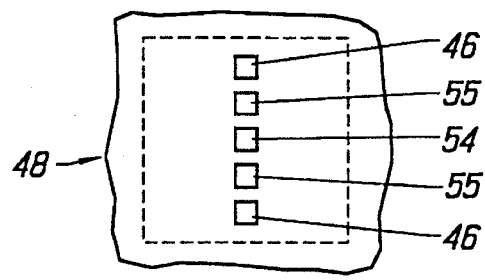
FIG. 2D is a plan view of the first insulation layer, underlying the first polysilicon layer depicted in FIG. 2C, according to the present invention.
Figure 2E:
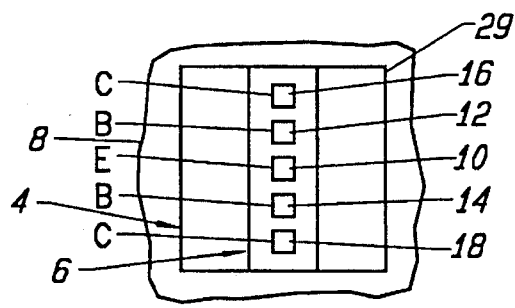
FIG. 2E is a plan view the transistor underlying the first insulation layer depicted in FIG. 2D, according to the present invention.

As shown in FIGS. 2C and 3, beneath the insulation #2 layer 30 are the polysilicon #1 traces 38, 40. The collector contacting polysilicon #1 trace 38 preferably has a generally "C" shape, and is about three units high by two units wide. Trace 38 has two contact regions 42 that are used to make "upward" electrical contact (through openings 32 in the insulation #2 layer) with the overlying polysilicon #2 collector trace 24 at C3, C1, as has been described. Trace 38 also has two contact regions 44 that are used to make "downward" electrical contact (through openings 46 in insulation #1 layer 48) with the underlying collector regions 18, 16. FIGS. 2C and 3 also depict the generally "T" shaped emitter contacting polysilicon #1 trace 40 that is preferably about three units high by two units wide. Trace 40 has contact regions 50 that are used to make "upward" electrical contact (through openings 36 in the insulation #2 layer) with the overlying polysilicon #2 emitter trace 28 at E1, E3, as has been described. Trace 40 also has a contact region 52 through which "downward" electrical contact (through opening 54 in insulation #1 layer 48) is made with the transistor emitter region 10. The openings 46, 54, 55, and the described "upward" and "downward" electrical connections therethrough are fabricated using standard techniques known to those skilled in the semiconductor fabrication arts. The insulation #1 layer 48 also includes two openings 55 permitting "upward" /"downward" electrical contact between transistor 6's base regions 12, 14 and the polysilicon #2 trace 26. The preferred location of openings 46, 54, 55 in the insulation #1 layer 48 is depicted in FIG. 2D, while FIGS. 2E and 3 depict the underlying transistor 6 and substrate 8.

While the preferred embodiment uses the generally "C" and "T" shaped polysilicon #1 traces 38, 40 described above, it is understood that other trace shapes could also be used. However, whatever trace shape is adopted, it is preferred that traces 38, 40 fit together compactly over the underlying transistor cell area (as shown in FIG. 2C), and are oversized to facilitate redundant upward electrical contacts with the polysilicon #2 traces 24, 28. Further, traces 38, 40 must leave open areas at the polysilicon #1 level facilitating electrical contact between the polysilicon #2 trace 26 and the underlying transistor base regions 12, 14 (see for example FIG. 2C).

As shown in FIG. 3, the polysilicon #2 traces 24, 26, 28 are covered with an insulation #3 layer 56 that defines up to nine option openings 58, denoted OC1, OC2, OC3, OE1, OE2, OE3, OB1, OB2, OB3. These option openings 58 are preferably arranged in a 3×3 matrix so as to overlie the 3×3 matrix of option contacts (C1, C2, C3, E1, E2, E3, B1, B2, B3) in traces 24, 26, 28. Depending upon the ASIC design (and thus upon the configuration of the overlying metal #1 trace layer 60) not all nine option openings 58 may actually be opened during fabrication. For example, in FIG. 3, only five option openings 50 are actually open (namely OC3, OC1, OE3, OB1).

Generally, if a metal #1 trace traverses a matrix point (C1, C2, C3, B1, B2, B3, E1, E2, E3), the option opening 58 overlying the traversed matrix point will not be opened during fabrication. For example, at the top of FIG. 3, a metal #1 trace 62 is depicted generally traversing the center region of a transistor cell 4. Thus, the underlying center option openings OC2, OB2, OE2 are not opened during fabrication, thereby insulating the underlying transistor 6 from the traverse interconnect trace 62. However because of the redundancy of electrical contacts to the underlying transistor 6, metal #1 traces 64 and/or 66 may still contact transistor 6's collector by opening, respectively, OC3, OC1. Further, metal #1 trace 68 can still contact transistor 6's base by opening OB1, and metal #1 trace 70 can still contact transistor 6's emitter by opening OE3. Thus, even though trace 62 traverses the center region of transistor 6, the underlying transistor 6 is completely functional (by virtue of not opening the traversed option openings OC2, OB2, OE2), and electrical contact to the emitter, base, collector regions of the transistor is still possible. Normally a layer of insulation 70 is deposited atop the metal #1 traces. If desired, further conductive and insulative layers could be deposited atop the insulation #4 layer 70, depending upon the ASIC being implemented.

Figure 4:
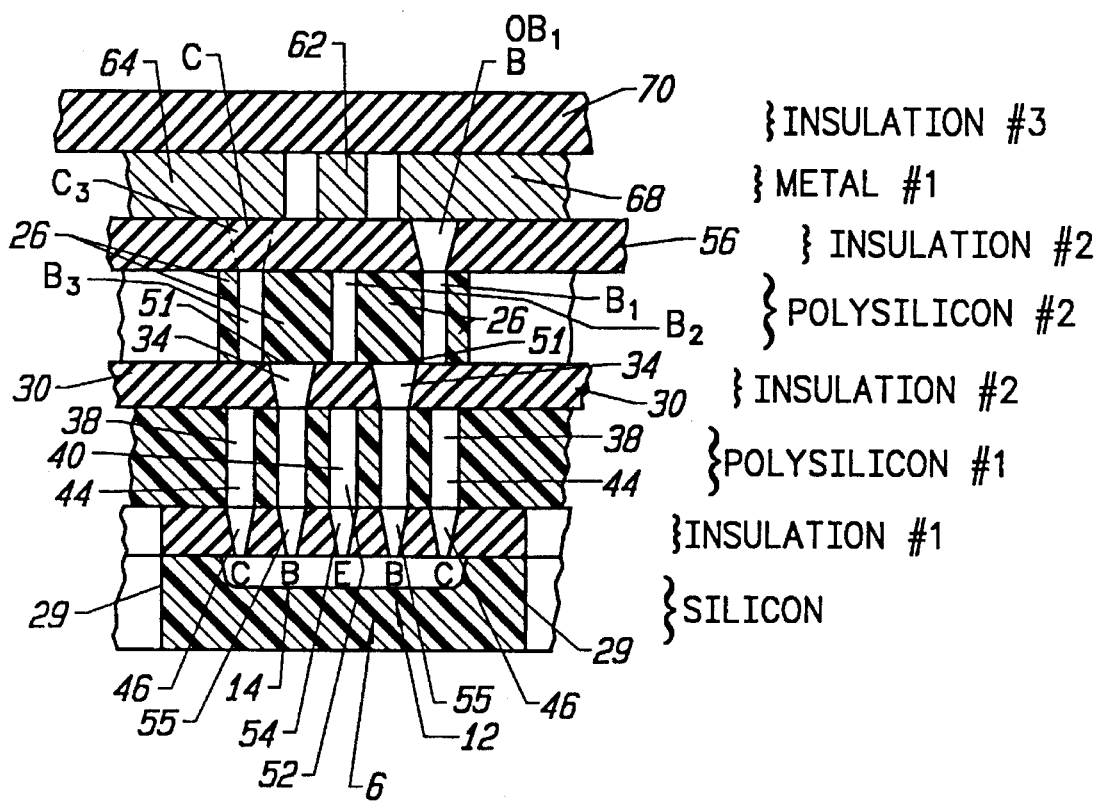
FIG. 4 is a sectional view of the cell shown in FIG. 3, taken along a section line X—X, defining a vertical plane through the length of the cell transistor.

FIG. 4 illustrates, in cross-section, the nature of the "upward" and "downward" connections that have been described, and further depicts the metal #1 trace 62 as it traverses the center region overlying transistor 6. Trace 68, for example, electrically downward contacts the polysilicon #2 base trace 26 via option opening OB1, which is opened during fabrication. Region 51 of trace 26 in turn downward contacts base 12 of transistor 6 through openings 34 (in insulation #2 30) and 55 (in insulation #1 48). If another metal #1 trace required contact to, say, base 14, such contact would be facilitated in a similar manner. Note that because trace 62 traverses a portion of the underlying transistor, the underlying option opening OB2 was not opened during fabrication. Thus, the presence of trace 62 in no way affects operation of transistor 6 because the insulation #2 layer 56 has not been opened at OC2, OB2 or OE2 (see top of FIG. 3). However because of the redundancy provided by the present invention, even through the center contact points in the 3×3 matrix at the polysilicon #2 level are not used, contact to the underlying transistor 6 may still be made using contact points C3, C1, B3, B1, E3, E1. Non-traversing trace 68, for example, is depicted as using contact point B1, which was made available by opening option opening OB1 during fabrication.

Figure 5A:
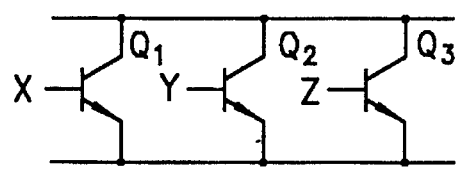
FIG. 5A is a partial schematic of a circuit to be implemented on an array.
Figure 5B:
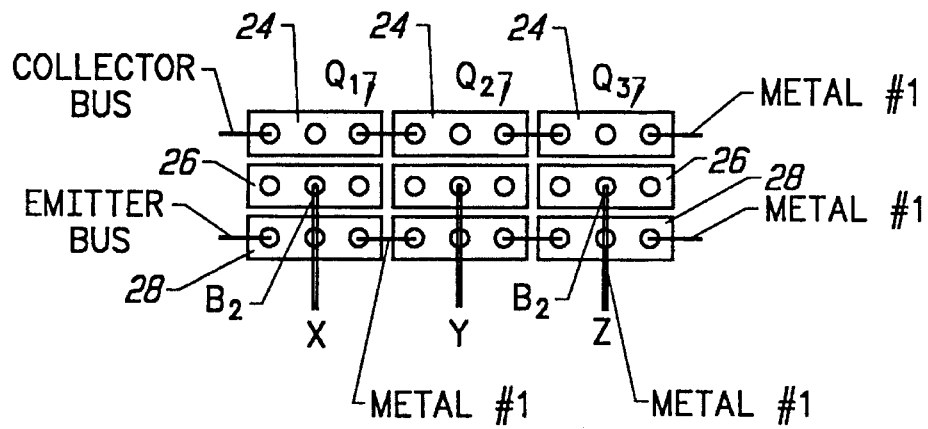
FIG. 5B is a plan view of the metal #1 layer of an array implementing the circuit of FIG. 5A, according to the present invention.
Figure 5C:
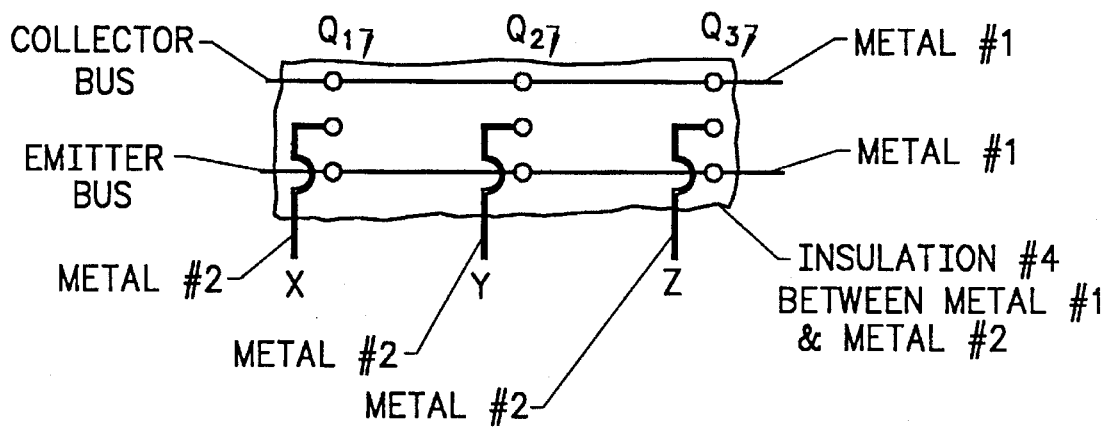
FIG. 5C is a cutaway plan view of the metal #2, insulation #4, and metal #1 layers of an array implementing the circuit of FIG. 5A, according to the prior art.

FIG. 5A schematically illustrates three transistors, each having their collectors connected together, their emitters connected together, and with separate signals X, Y, Z being presented to the individual bases. FIG. 5B shows the ease with which an ASIC may be dedicated to the above schematic. The redundancy provided by the present invention and the constant, replicated pattern of polysilicon #2 traces 24, 26, 28 readily allows the collector and emitter connections to be made. Note that the traces from X, Y, Z to the transistor bases traverses the center region of traces 28. In the present invention this is readily accomplished, as described, by not opening the underlying option openings in the insulation #3 layer. By contrast, in the prior art implementation of FIG. 5C, additional dedicated layers must be added. Thus while FIG. 5C can implement the collector and emitter connections using metal #1 traces, it is necessary to make the traversing X, Y, Z base connections by adding a dedicated layer of metal #2 traces, which layer must be separated from the metal #1 traces by an insulation #4 layer. Needless to say, it is more costly, more time consuming, and less productive of array yield to customize an ASIC by adding the dedicated metal #2 traces indicated in FIG. 5C, than by traversing according to the present invention, as indicated by FIG. 5B. While FIGS. 5A and 5B depict a simple circuit and implementation thereof, it will be appreciated that complex circuitry and traverses may be implemented at the metal #1 level, according to the present invention.

While the present invention has been described with respect to customizing an array having a plurality of transistor cells, it is understood that the cells could each contain a field effect transistor instead. Further, each cell could contain a diode, or a capacitor, or a resistor, to be used in an array by customizing the metal #1 traces as described above. The diodes, capacitors, and resistors in each cell could themselves be formed from bipolar or field effect transistors.

Modifications and variations may be made to the disclosed embodiments without departing from the subject and spirit of the invention as defined by the following claims.

What is claimed is:

1. A method of fabricating an application specific integrated circuit containing an array of devices, the method permitting alteration of a single conducting layer to customize the integrated circuit and further permitting traversing connections, the method comprising:

(a) fabricating a replicated pattern of devices upon a substrate, each device defining a cell area and including a first region, a second region, and a third region, adjacent device cells abutting one another;

(b) depositing over each device cell area a first layer of conducting material defining first, second and third stripes;

each said first stripe being sized to create at least two contact region thereon for redundant upward electrical contact, and making redundant downward electrical contact with said first region;

each said second stripe being sized to create at least two contact regions thereon for redundant upward electrical contact, and making redundant downward electrical contact with said second region;

each said third stripe being sized to create at least two contact regions thereon for redundant upward electrical contact, and making redundant downward electrical contact with said third region;

(c) depositing, over said first layer of conducting material, a layer of insulating material defining an option opening disposed over each said contact region on each said stripe for facilitating upward electrical contact with each said stripe, a matrix of option openings being formed thereby;

each said option opening capable of being opened or remaining closed during fabrication of the integrated circuit;

an opened option opening facilitating upward electrical contact with an underlying said contact region of a said stripe and thus with a region of said device;

each said stripe thereby providing a redundancy of connections between a region of said device and a portion of said matrix of option openings;

a closed option opening insulating an underlying said region of a said stripe and thus a region of said device from any layer overlying said layer of insulating material;

(d) depositing, over said layer of insulating material, a second layer of conductive material forming traces customizing the integrated circuit;

a first said trace being in downward electrical contact with a region of said device if a said option opening underlying said trace is opened during fabrication;

a second said trace being allowed to traverse a region of said cell area by leaving unopened any said option opening beneath said traversing trace;

said redundancy of connections between said device and said matrix of option openings permitting a said second trace to traverse a region of said cell area while still providing at least one electrical contact to each region of said device for use by said first trace;

the redundancy of connections and ability to traverse permitting customization of the integrated circuit by altering said second layer of conductive materials and by selectively opening option openings in said layer of insulating material, and further permitting said device cell areas to abut without requiring dedicated space to accommodate traversing traces.

2. The method of claim 1, wherein said device includes a transistor.

3. The method of claim 1, wherein said device is chosen from the group consisting of a bipolar transistor, a junction field effect transistor, and a metal-oxide-silicon field effect transistor.

4. The method of claim 1, wherein said device is a bipolar transistor, said first region is an emitter region thereof, said second region is a base region thereof, and said third region is a collector region thereof.

5. The method of claim 1, wherein said first, second and third stripes form a replicated pattern.

6. The method of claim 1, wherein each said cell area is approximately three units by three units in size, and wherein each said first, second and third stripe is approximately one unit by three units in size and overlies a portion of said cell area.

7. The method of claim 1, wherein each said device has one first region, two second regions and two third regions.

8. The method of claim 4, wherein each said first, second and third stripe makes two downward electrical contacts, respectively, to said first, second and third regions of said device.

9. The method of claim 1, wherein each said first, second and third stripe is sized to create three contact regions thereon for redundant upward electrical contact.

10. The method of claim 6, wherein said matrix of option openings is arranged in a replicated pattern of three rows and three columns, permitting up to three redundant electrical contacts with each of said first, second and third regions of said device.

11. The method of claim 1, wherein said step of fabricating a pattern includes etching a groove defining a perimeter of each said device cell area.

12. A method of fabricating an application specific integrated circuit containing an array of devices, the method permitting alteration of a single conducting layer to customize the integrated circuit and permitting traversing connections, the method comprising:

(a) fabricating a pattern of replicated devices upon a substrate, each device defining a cell area and including an first region, at least one second region, and at least one third region, adjacent device cells abutting one another;

(b) depositing over said pattern of devices a first layer of insulating material that defines a through opening overlying each said first, second and third region;

(c) depositing over said first layer of insulating material a first layer of conducting material including a pattern of third traces and first traces, a third and first pair of said traces overlying each said cell area;

a portion of said third trace overlying and making redundant downward electrical contact, through a said opening in said first layer of insulating material, with said third region of said device;

a portion of said first trace overlying and making redundant downward electrical contact, through a said opening in said first layer of insulating material, with said first region of said device;

each said third and first trace being sized to permit redundant upward electrical contact at at least two regions thereon;

(d) depositing over said first layer of conducting material a second layer of insulating material defining at least first, second and third through openings over said cell area;

said first opening permitting downward electrical contact therethrough with said third on said first layer of conducting material;

said second opening permitting downward electrical contact therethrough with said first trace on said first layer of conducting material;

said third opening permitting downward electrical contact therethrough with said second region;

(e) depositing over said second layer of insulating material a second layer of conducting material defining a pattern of third, second and first stripes;

said third stripe being sized to create at least two redundant contact regions thereon and making downward electrical contact, through an opening in said second insulating layer, with said third trace on said first layer of conducting material;

said second stripe being sized to create at least two redundant contact regions thereon and making downward electrical contact through an opening in said second insulating layer and in said first insulating layer with said second region;

said first stripe being sized to create at least two redundant contact regions thereon and making downward electrical contact, through an opening in said second insulating layer, with said first trace on said first layer of conducting material;

said third, second and first stripes thus each presenting at least two contact regions thereon for making electrical contact, respectively, with said third, second and first regions of said device;

(f) depositing over said second layer of conducting material a third layer of insulating material defining an option opening disposed over each said contact region for upward electrical contact on each said stripe, a matrix of option openings being formed thereby, each said stripe providing a redundancy of connections between a region of said device and a portion of said matrix of option openings;

each said option opening capable of being opened or remaining closed during fabrication of the integrated circuit;

each opened option opening facilitating upward electrical contact with an underlying said contact region of a said stripe and thus with a region of said device;

each closed option opening insulating an underlying said contact region of a said Stripe and thus insulating a region of said device from any layer overlying said layer of insulating material;

(g) depositing over said third layer of insulating material a third layer of conductive material forming traces customizing the integrated circuit;

a first said trace being in downward electrical contact with a region of said device if a said option opening underlying said trace was opened during fabrication;

a second said trace being allowed to traverse a region of said cell area by not opening any said option opening beneath said traversing trace;

said redundancy of connections between said device and said matrix of option openings permitting said second trace to traverse a region of said cell area while still providing at least one electrical contact to each region of said device for use by said first trace;

the redundancy of connections and ability to traverse permitting customization of the integrated circuit by altering said third layer of conductive materials and by selectively opening option openings in said third layer of insulating material, and permitting said device cell areas to abut without requiring dedicated space to accommodate traversing traces.

13. The method of claim 12, wherein said device includes a transistor.

14. The method of claim 12, wherein said device is chosen from the group consisting of a bipolar transistor, a junction field effect transistor, and a metal-oxide-silicon field effect transistor.

15. The method of claim 12, wherein said device is a bipolar transistor, said first region is an emitter region thereof, said second region is a base region thereof, and said third region is a collector region thereof.

16. The method of claim 12, wherein said pattern of first and third traces on said first layer of conductive material is replicated.

17. The method of claim 12, wherein said pattern of first, second and third stripes on said second layer of conductive material is replicated.

18. The method of claim 12, wherein each said cell area is approximately three units by three units in size, and wherein each said first, second and third stripe is approximately one unit by three units in size and overlie a portion of said cell.

19. The method of claim 12, wherein each said device has one first region, two second regions and two third regions.

20. The method of claim 12, wherein said third and first traces on said first layer of conducting material are, respectively, "C" and "T" shaped, a pair of said third and first traces overlying each device cell area.

21. The method of claim 12, wherein:

each said third and first stripe makes two downward electrical contacts, respectively, with said third trace and said first trace on said first layer of conducting material;

said first layer of conducting material third trace makes downward electrical contact with each said third region of said device;

said first layer of conducting material first trace makes downward electrical contact with said first region of said device; and said second layer of conductive material second stripe makes downward electrical contacts with each said second region of said device.

22. The method of claim 12, wherein each said first, second and third stripe is sized to create three contact regions thereon for redundant upward electrical contact.

23. The method of claim 22, wherein said matrix of option openings is arranged in a pattern of three rows and three columns, permitting up to three redundant electrical contacts with each of said first, second and third regions of said device.

* * * * *